United States Patent
Graumann et al.

(10) Patent No.: US 9,564,921 B1
(45) Date of Patent: Feb. 7, 2017

(54) METHOD AND SYSTEM FOR FORWARD ERROR CORRECTION DECODING BASED ON A REVISED ERROR CHANNEL ESTIMATE

(71) Applicant: PMC-SIERRA US, INC., Sunnyvale, CA (US)

(72) Inventors: Peter Graumann, Calgary (CA); Sean Gibb, Calgary (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 132 days.

(21) Appl. No.: 14/613,805

(22) Filed: Feb. 4, 2015

(51) Int. Cl.
*H03M 13/11* (2006.01)

(52) U.S. Cl.
CPC ....... *H03M 13/1125* (2013.01); *H03M 13/114* (2013.01); *H03M 13/1131* (2013.01)

(58) Field of Classification Search
CPC ............ H03M 13/114; H03M 13/1125; H03M 13/1131
See application file for complete search history.

(56) References Cited

U.S. PATENT DOCUMENTS 7,656,707 B2   2/2010   Kozlov
7,930,620 B2 *  4/2011   Choi ................. H03M 13/1117
                                                         714/800
2013/0173985 A1   7/2013   Chung et al.

FOREIGN PATENT DOCUMENTS

EP   1 689 085 A2 *   9/2006   ............ H03M 13/45
EP   2763042 A1       8/2014

OTHER PUBLICATIONS

Tong et al., On short forward error correcting codes for wireless communication systems, 2007, IEEE, pp. 391-396.*

* cited by examiner

*Primary Examiner* — Shelly A Chase
(74) *Attorney, Agent, or Firm* — Dennis R. Haszko

(57) ABSTRACT

An FEC codeword comprises channel information indicating the reliability of the information contained by the FEC codeword. The channel information can be used to generate an initial error channel estimate. Based on the initial error channel estimate, an FEC decoder can decode the FEC codeword to increase the reliability of the information contained by the FEC codeword. According to the present disclosure, a method and system of decoding comprises: comparing a current codeword to a previous codeword in order to identify bits corrected between the previous and current codewords; revising an error channel estimate based on the identified corrected bits, the revised estimate representing a change in the error channel over time; and decoding the codeword based on the revised error channel estimate.

19 Claims, 7 Drawing Sheets

METHOD AND SYSTEM FOR FORWARD ERROR CORRECTION DECODING BASED ON A REVISED ERROR CHANNEL ESTIMATE

FIELD

The present disclosure relates to forward error correction (FEC) decoder systems.

BACKGROUND

Forward Error Correction (FEC) is a method of encoding and decoding information for transmission over a noisy communication channel. Various implementations of FEC, such as Low-Density Parity-Check and Turbo codes, are known.

Low-Density Parity-Check (LDPC) decoder systems are current generation iterative soft-input FEC decoder systems that have found increasing popularity in FEC applications where low error floor and high performance are desired. LDPC codes are defined in terms of a two-dimensional parity-check matrix, referred to as an H matrix, that represents a set of parity check equations such that cH=0 where c is a codeword of the LDPC code.

An H matrix is a low-density matrix that can be represented by a sparse bipartite graph, known as a Tanner graph. A Tanner graph includes check nodes and variable nodes (otherwise known as bit nodes). For LDPC codes, the check nodes denote rows of the H matrix and the variable nodes represent the columns of the H matrix. An edge of the Tanner graph connects a check node to a variable node if a nonzero entry (i.e., a one) exists in the intersection of the corresponding row and column of the H matrix.

Decoding an LDPC codeword requires solving a set of parity check equations according to the H matrix. A commonly used decoding method is based on a two-step iterative process that uses soft decisions and is based on a belief propagation method. The process starts by determining soft-values of a LDPC codeword and loading those soft-values, such as log-likelihood ratios (LLRs) of the LDPC codeword, into the variable nodes. In the first half-iteration, each check node takes the output of the connected neighboring variable nodes and calculates a soft value. In the second-half iteration, the soft value at each variable node is updated by combining the soft value at the particular variable node (the variable node information) with the soft values output by the connected neighboring check nodes (the extrinsic information) for use in the subsequent iteration.

A common approach for calculating the soft value output by each check node is the min-sum method, or min-sum algorithm. In the min-sum method, the magnitude of the soft value of each check node is calculated by determining the minimum magnitude of all of the outputs of the connected neighboring variable nodes and the sign of the soft value output by each check node is calculated as the one bit binary multiplication of the signs of the output of the connected neighboring variable nodes.

Soft-decoding a LDPC codeword causes convergence of the solved LDPC codeword with the true LDPC codeword for most communication channels. Convergence is achieved over a number of iterations of the two-step iterative process described above and results in a corrected LDPC codeword without errors.

A category of LDPC codes, known as quasi-cyclic (QC) codes, generates an H matrix with features that improve the ease of implementing an LDPC encoder and decoder. In particular, it is possible to generate a QC-LDPC H matrix where some rows are orthogonal to each other. The orthogonal rows are treated as a layer, and the orthogonal rows within a layer can be processed in parallel (hereinafter referred to as layer processing), thus reducing the iterative cost of the decoder.

Improvements to LDPC and FEC decoder systems that improve the performance, such as decoding time or decoding accuracy, or both, of the LDPC or FEC decoder system are therefore desirable.

BRIEF DESCRIPTION OF THE DRAWINGS

Embodiments of the present disclosure will now be described, by way of example only, with reference to the attached Figures.

DETAILED DESCRIPTION

Figure 1:
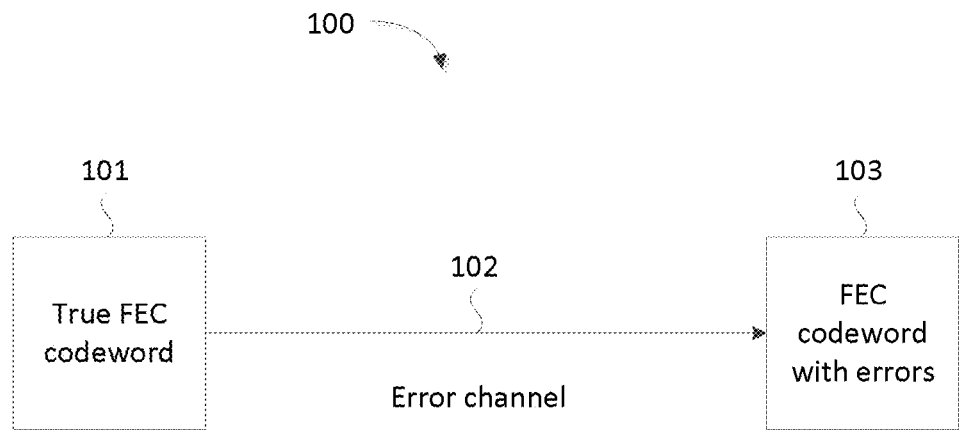
FIG. 1 is a diagram of an FEC system for accessing data over an error channel.

According to embodiments of the present disclosure, an FEC decoder such as an LDPC decoder revises an initial error channel estimate by first comparing an updated LDPC codeword to a received LDPC codeword in order to identify corrected bits, and then by counting the corrected bits to revise the initial error channel estimate. The revised error channel estimate allows the LDPC decoder to further decode the updated LDPC codeword using the revised error channel estimate, improving both the speed and accuracy of the overall LDPC decoding process.

While embodiments of the present disclosure are described with reference to LDPC decoding, the advantageous decoding steps described herein are also appropriate for Turbo code embodiments and embodiments of other iterative FEC soft-decoders.

In an embodiment of the present disclosure, it is provided a method for decoding a Forward Error Correction (FEC) codeword, the method comprising: receiving the FEC codeword comprising soft-values based on an initial error channel estimate; and decoding the received FEC codeword, wherein the decoding is iterative and includes first and second belief propagation updates among a plurality of belief propagation updates, the decoding comprising: performing the first belief propagation update on the received FEC codeword to generate a first updated FEC codeword, the first belief propagation update based on check-node and variable-node processing the soft-values of the FEC codeword; comparing the received FEC codeword to the first updated FEC codeword in order to identify bits that have been corrected by decoding; revising the initial error channel estimate based on the identified corrected bits; performing an error channel update on the first updated FEC codeword to generate a second updated FEC codeword, the error channel update based on processing the soft-values of the FEC codeword using the revised error channel estimate; and performing the second belief propagation update on the second updated FEC codeword to generate a third updated FEC codeword, the belief propagation update based on check-node and variable-node processing the soft-values of the FEC codeword.

In another embodiment of the present disclosure, the method further comprises storing the received FEC codeword at an initial data memory.

In another embodiment of the present disclosure, revising the initial error channel estimate comprises counting the number of times each input condition of all of the bits of the received FEC codeword is decoded to a zero state and to a one state.

In another embodiment of the present disclosure, revising the initial error channel estimate further comprises computing, according to the equation newLLRn=log(Pn0/Pn1), where n represents the input condition, the probabilities of each input condition being decoded to the zero state and to the one state.

In another embodiment of the present disclosure, the FEC codeword is a Low Density Parity Check (LDPC) codeword and decoding comprises decoding the LDPC codeword.

In another embodiment of the present disclosure, decoding the LDPC codeword is performed using a layered LDPC decoder.

In another embodiment of the present disclosure, the decoding further comprises a plurality of iterative belief propagation updates, and a further error channel update is performed before each further belief propagation update.

In another embodiment of the present disclosure, the soft-values are integers, and the integer values of the soft-values are dithered to provide a fractional-like soft-value.

In an embodiment of the present disclosure, it is provided a decoder for decoding a Forward Error Correction (FEC) codeword, the decoder comprising: a main memory for receiving the FEC codeword comprising soft-values based on an initial error channel estimate; a soft-decoder for decoding the received FEC codeword, wherein the decoding is iterative and includes first and second belief propagation updates among a plurality of belief propagation updates, the decoding comprising performing a first belief propagation update on the received FEC codeword to generate a first updated FEC codeword, the first belief propagation update based on check-node and variable-node processing the soft-values of the FEC codeword; and a soft-value updater configured to: compare the received FEC codeword to the first updated FEC codeword in order to identify bits that have been corrected by decoding; revise the initial error channel estimate based on the identified corrected bits; and performing an error channel update on the first updated FEC codeword to generate a second updated FEC codeword, the error channel update based on processing the soft-values of the FEC codeword using the revised error channel estimate; and the soft-decoder further configured to perform a second belief propagation update on the second updated FEC codeword to generate a third updated FEC codeword, the second belief propagation update based on check-node and variable-node processing the soft-values of the FEC codeword.

In another embodiment of the present disclosure, the decoder further comprises an initial data memory for storing the received FEC codeword.

In another embodiment of the present disclosure, the main memory overwrites the received FEC codeword with the first updated FEC codeword, and the soft-value updater compares the received FEC codeword in the initial data memory to the first updated FEC codeword in the main memory.

In another embodiment of the present disclosure, the soft-value updater revises the initial error channel estimate by counting the number of times each input condition of all of the bits of the received FEC codeword is decoded to a zero state and to a one state.

In another embodiment of the present disclosure, the soft-value updater revises the initial error channel estimate by further computing, according to the equation newLLRn=log(Pn0/Pn1), where n represents the input condition, the probabilities of each input condition being decoded to the zero state and to the one state.

In another embodiment of the present disclosure, the decoder is a Low Density Parity Check (LDPC) decoder for decoding an LDPC codeword.

In another embodiment of the present disclosure, the decoder is a layered LDPC decoder.

In another embodiment of the present disclosure, the soft-decoder further performs a plurality of iterative belief propagation updates, and the soft-value updater performs a further error channel update before each further belief propagation update.

In another embodiment of the present disclosure, the decoder further comprises a controller to determine whether the initial error channel estimate exceeds a threshold of accuracy, and disabling the soft-value updater if the threshold is exceeded.

In another embodiment of the present disclosure, the soft-values are integers, and the soft-value updater dithers the integer values of the soft-values to provide a fractional-like soft-value.

In an embodiment of the present disclosure, it is provided a method of updating a soft-value of an FEC codeword, the method comprising: comparing a current state of the FEC codeword to a previous state of the FEC codeword in order to identify bits corrected between the previous and current states of the FEC codeword; revising an error channel estimate based on the identified corrected bits, the revised estimate representing a change in the error channel over time; and updating the soft-value of the FEC codeword according to the revised error channel estimate.

Other aspects and features of the present disclosure will become apparent to those ordinarily skilled in the art upon review of the following description of specific embodiments in conjunction with the accompanying figures.

FIG. 1 is a diagram of an FEC system for accessing data over an error channel. In an exemplary FEC system 100, a true FEC codeword 101 is accessed over an error channel 102. The accessed FEC codeword 103 has been corrupted by the error channel and therefore contains errors. Since the information in the accessed FEC codeword 103 is organized according to an FEC code, the errors in the FEC codeword 103 may be corrected by decoding the FEC codeword 103 at an appropriate FEC decoder.

A channel in any application defines the characteristics of the received information at the input to a receiver. A physical channel can include many features such as; inter-symbol interference, fading channels, AWGN noise, non-linear effects, and other sources of reception error. The channel in a given system leads to bit errors during reception that may be corrected using a FEC system.

The error channel 102 may represent a variety of different physical sources of reception errors. For example, the error channel 102 may represent a wireless communication system, in which case the errors introduced into the FEC codeword may be the result of antenna noise. Or, the error channel 102 may represent a wired communication system, in which case the errors introduced into the FEC codeword may be the result of crosstalk.

In an embodiment of the present disclosure, the error channel represents a data storage system. In this embodiment, the errors introduced into the FEC codeword may, for example, be the result of: power, voltage and temperature (PVT) variations over time; device page number variation; die to die variation; data retention state variation over time; program-erase cycle variation over time; and Flash memory vendor variation.

When a true FEC codeword 101 is first stored to a data storage system, the system begins to behave as an error channel 102. The phenomena listed above may cause the true FEC codeword 101 to be initially written to the data storage system with errors. As time passes and the codeword (with or without errors) is stored in the data storage system, additional errors may be introduced into the stored codeword. When the codeword is retrieved from the data storage system, further errors may be introduced into the codeword. Modelling the errors that are likely to be introduced into the FEC codeword 101 will generate an initial estimate of FEC codeword 103, which can help the FEC decoder correct the errors in FEC codeword 103.

In recent years Flash storage devices have become common place, being used in a host of mobile devices, Solid State Drives (SSD) for personal computers, and even in Enterprise grade SSDs for data center storage. Flash devices themselves present challenging error channel conditions for any application.

The major use of Flash is to write digital 1s and 0s to the Flash device and then to simply read 1s and 0s from the device with a single read operation. The standard Flash channel is typically a Binary Asymmetric Channel and generally has an error bias of between 5 and 30 times, depending on the conditions of a given Flash device. In some applications, it is also possible to alter the conditions of the read and re-read information from the Flash device further "softening" or improving the collected information. However, each subsequent read increases latency so it is typically more desirable to recover information from the Flash device using only a single read operation.

Figure 2:
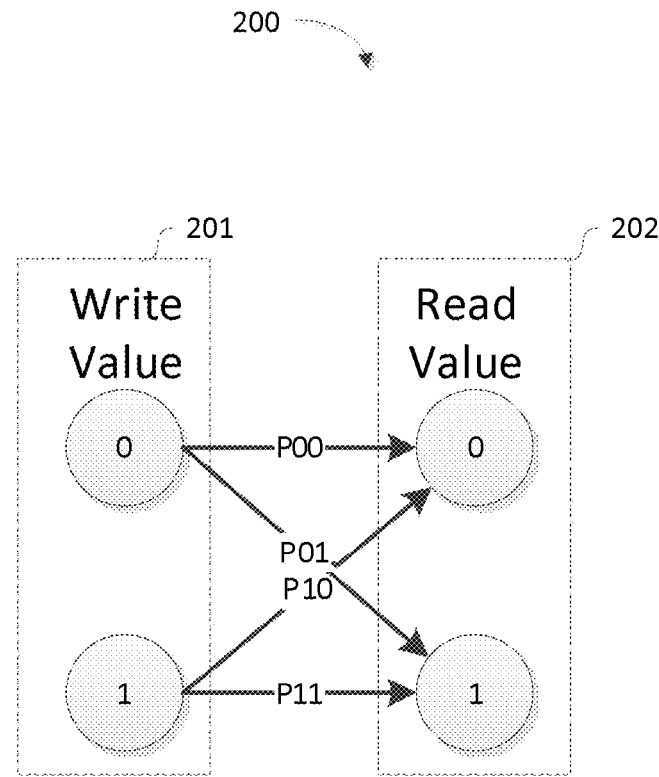
FIG. 2 is a diagram representing transmission of data over an exemplary binary asymmetric channel.

FIG. 2 is a diagram representing transmission of data over an exemplary binary asymmetric channel, which the FEC decoder will model for decoding the FEC codeword. Typically, the FEC decoder converts the received information in the FEC codeword into soft-values or LLRs before soft-decoding the FEC codeword. The estimated soft-values can be calculated based on an understanding of the error probabilities for a given channel. A simple Binary Asymmetric Channel (BAC) 200 is shown in FIG. 2. The true written (or transmitted) information 201 is either a "0" or a "1" and the received values 202 are either a "0" or a "1".

In an embodiment of the present disclosure, the FEC decoder models the error channel 102 as a binary asymmetric channel 200. To derive the correct soft values for the BAC 200, four probabilities are used by the FEC decoder. P00 is the probability that a "0" was both sent and received; P01 is the probability that "0" was sent and that a "1" was received; P10 is the probability that a "1" was sent and a "0" was received; and P11 is the probability that a "1" was sent and a "1" was received.

These four probabilities (P00, P01, P10, and P11) are converted to LLRs to be used during soft decoding. LLR values are used in many soft-decoding applications to simplify internal computations within the decoder. The LLRs for BAC 200 are computed as:

$$LLR0 = \log(P00/P10) \quad \text{(Equation 1)}$$

$$LLR1 = \log(P01/P11) \quad \text{(Equation 2)}$$

The probabilities are further constrained by the following equations:

$$P00 + P01 = 1.0 \quad \text{(Equation 3)}$$

$$P11 + P10 = 1.0 \quad \text{(Equation 4)}$$

In other embodiments of the present disclosure, the FEC decoder models the error channel 102 with additional read states. A data storage system may store information in multiple states (e.g. in a multi-level cell (MLC) NAND Flash memory) rather than in binary states. Generally, an MLC memory provides greater data density per cell (e.g. by storing two bits per cell, three bits per cell in a so-called "Triple Level Cell", or even more bits per cell), but suffers from a higher error rate. Therefore, it is particularly advantageous to improve the performance of an FEC decoder for an MLC memory.

In an embodiment with $2^n$ receiver states, the same LLR arithmetic as in the binary case is applied to each of these $2^n$ states. Generally, these LLRs are computed as:

$$LLRn = \log(P0n/P1n) \quad \text{(Equation 5)}$$

In Equation 5, P0n is the probability that state "n" was received and a "0" was sent from the transmitter and P1n is the probability that state "n" was received and a "1" was sent from the transmitter.

Figure 3:
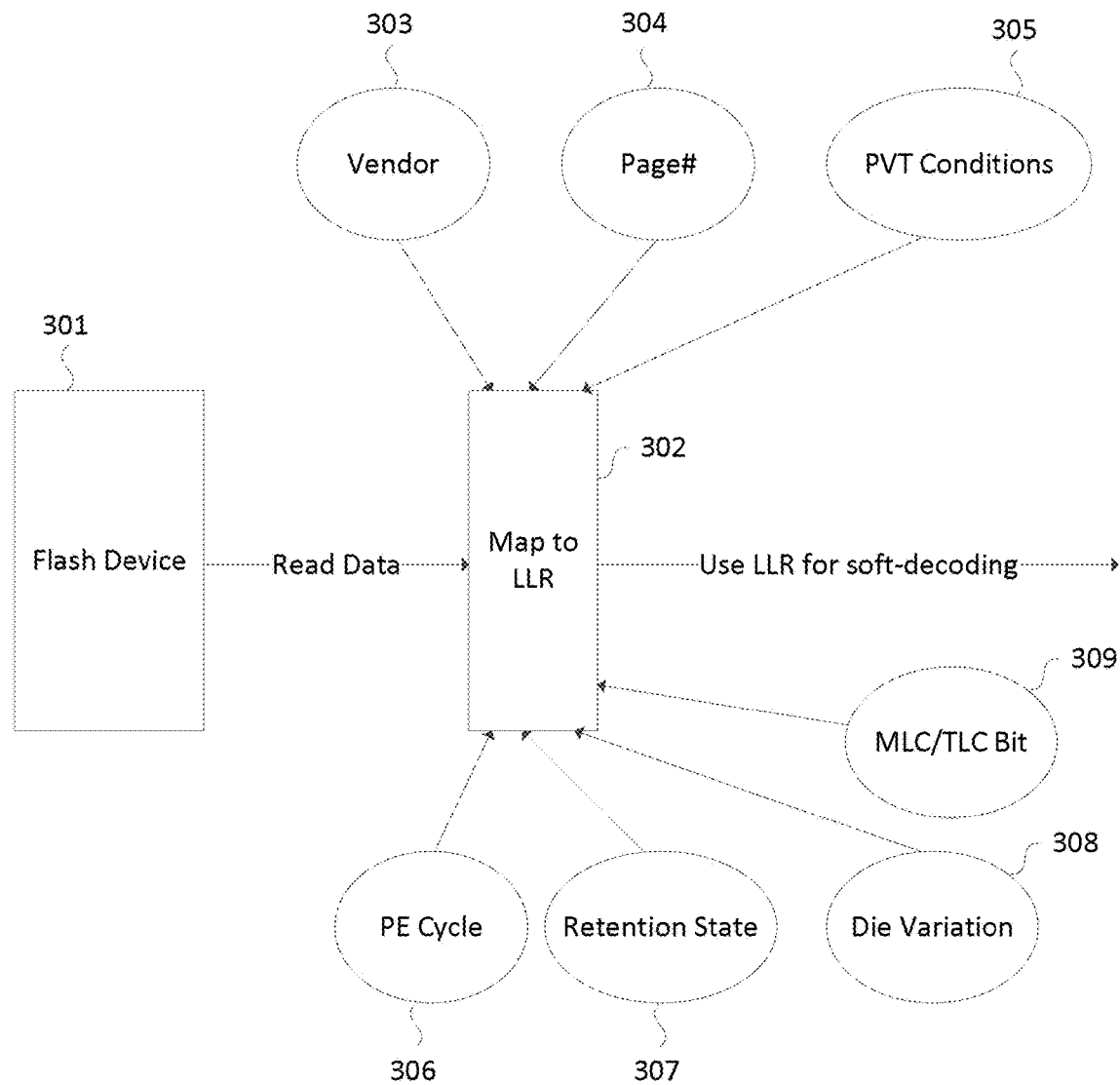
FIG. 3 is a diagram showing sources of error in a storage system error channel.

FIG. 3 is a diagram showing sources of error in a storage system error channel. A Flash device 301 stores data in FEC codewords. An FEC decoder reads the FEC codeword from the Flash device 301 and estimates the initial probabilities of errors in the FEC codeword in order to generate soft-values or LLRs for soft-decoding the FEC codeword.

The estimate is based on a model 302 of the error channel 102 of the Flash device 301. The model 302 may comprise Flash vendor variation 303, which represents the probability of errors attributable to retrieving the FEC codeword from the Flash device 301 of a particular Flash vendor.

The model 302 may further comprise page number variation 304, which represents the probability of errors attributable to retrieving the FEC codeword from a particular page of the Flash device 301. Pages are physical groupings of memory cells in the Flash device 301. Different pages may have different error channel characteristics. While it may be theoretically possible to characterize and model the error channel due to page number variation, a practical implementation of such an error channel model would be unfeasible. The overhead (metadata read from Flash) necessary for characterizing page number variation would be unacceptably inefficient.

The model 302 may further comprise PVT condition variation 305 over time. PVT variation 305, during writing and reading of the FEC codeword, and particularly during retention of the FEC codeword, will affect the error channel of the Flash device 301. PVT variation 305 represents the probability of errors attributable to retrieving the FEC codeword from the Flash device 301 at a particular time, due to varying PVT conditions.

The model 302 may further comprise program-erase cycle variation 306 over time. The information stored on the Flash device 301 must be erased before any new information can be written to a given area of cells. The cycles of programming and erasing data on these cells significantly change the error channel of these cells over the lifetime of the Flash device 301. The program-erase cycle variation 306 represents the probability of errors attributable to retrieving the FEC codeword from cells of Flash device 301 at a particular time.

The model 302 may further comprise data retention variation 307 over time. Once information is written to the Flash device 301, the information begins to degrade over time. The rate of information decay within the Flash device 301 is also related to the temperature of the device. The data retention variation 307 represents the probability of errors attributable to retrieving the FEC codeword from a particular retention state of the Flash device 301 at a particular time.

The model 302 may further comprise die variation 308. Each individual device from a given family of Flash devices or from a given Flash vendor may have its own unique die-specific error channel characteristic. The die variation 308 represents the probability of errors attributable to retrieving the FEC codeword from a particular die of the Flash device 301.

The model 302 may further comprise MLC/TLC bit read variation 309. An MLC/TLC memory stores two, three, or more bits per cell. The MLC/TLC bit read variation 309 represents the probability of errors attributable to retrieving the bits of the FEC codeword from different levels of the MLC/TLC.

As previously discussed, in some cases it is desirable to recover information from the Flash device using only a single read operation. Improving the modelling of the error channel 102 will help to accurately recover information from the Flash device in a single read operation. However, understanding the statistics of the information being read from a given location on a given Flash device at a given time presents a challenge. The error channel 102 characteristics are dependent on a number of factors as described above and are generally time-varying in nature. This causes the modelling of the error channel 102 at any given time to be very difficult, leading to inaccurate LLR representations for soft-decoding the FEC codeword. This may also lead to reduced FEC decoder performance and increased decoder power consumption.

The error channel 102 characteristics may also be dependent on other un-modelled sources of error. Since un-modelled sources of error are by definition missing from any a priori error channel tracking method, it is advantageous to have a reactive error channel model for adapting the operation of the decoder to these un-modelled sources of error.

In some Flash devices, it is known to track the error channel characteristics over time but such tracking measures can only model a sub-set of all of the possible error channels in a storage system, and thus must make guesses regarding the time-varying components of the channel. Consequently, this known method of error channel tracking can only recover a portion of the error channel characteristics and often generates incorrect error channel estimations.

Figure 4:
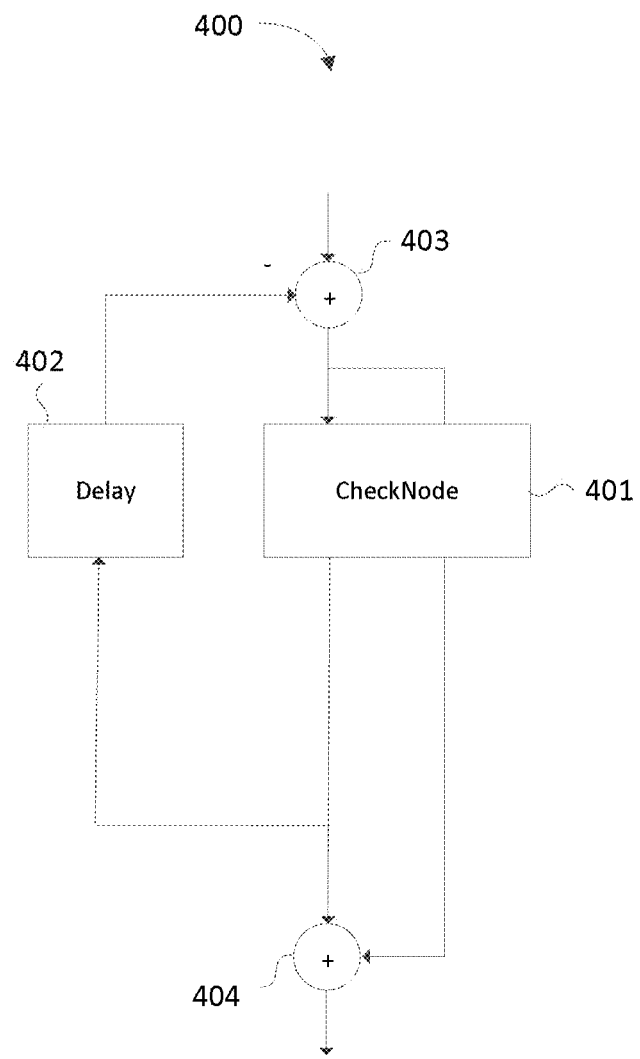
FIG. 4 is a block diagram of a conventional LDPC layer processor.

FIG. 4 is a block diagram of a conventional LDPC layer processor. A layer processor 400 comprises a check node processor 401, a delay element 402, and adders 403 and 404. The layer processor 400 receives a soft-value and processes the soft-value with a belief propagation method to update the soft-value according to constraints defined by the LDPC code of the LDPC layer processor.

Figure 5:
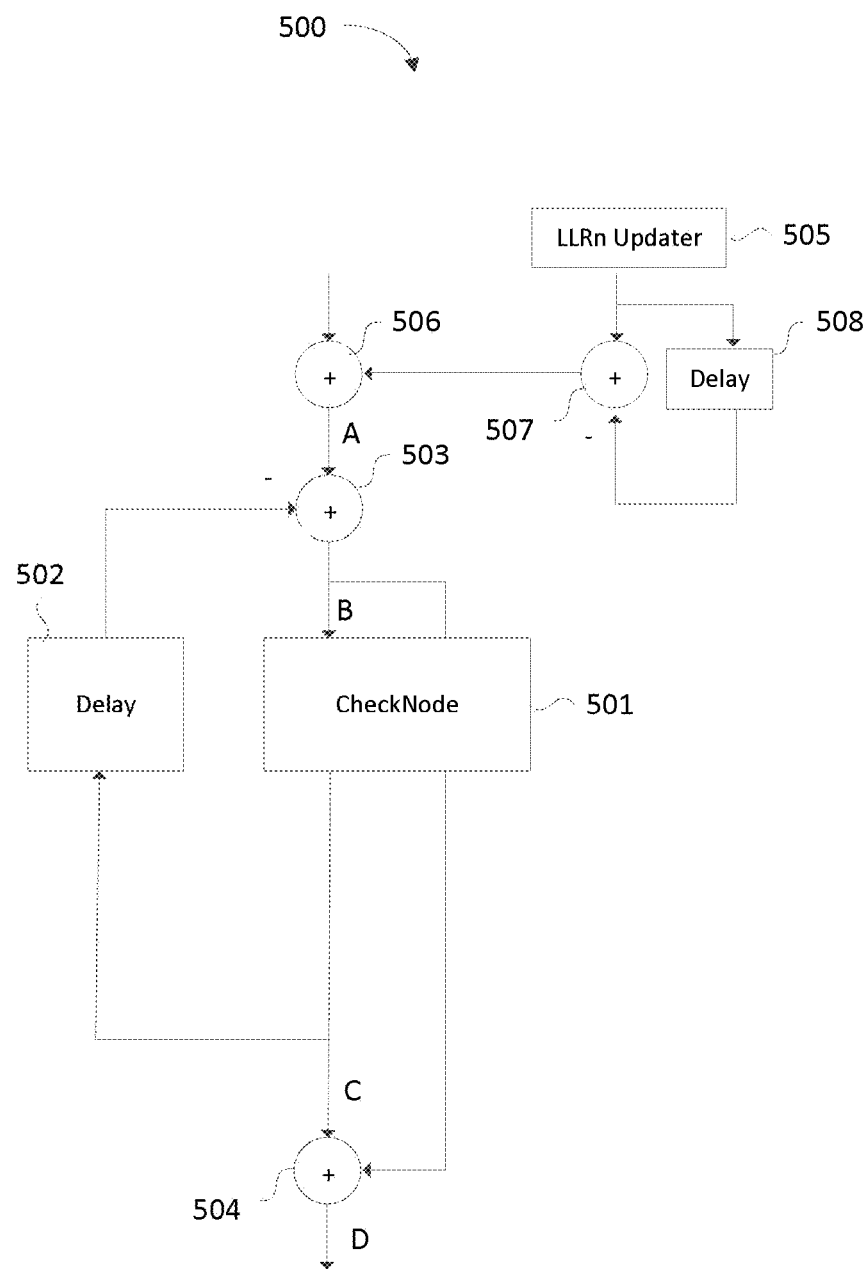
FIG. 5 is a block diagram of an LDPC layer processor according to an embodiment of the present disclosure.

FIG. 5 is a block diagram of an LDPC layer processor according to an embodiment of the present disclosure. According to embodiments of the present disclosure, an LDPC layer processor revises an initial error channel estimate first by comparing an updated LDPC codeword to a received LDPC codeword in order to identify corrected bits, and then by counting the corrected bits to revise the initial error channel estimate. The revised error channel estimate allows the LDPC layer processor to further decode the updated LDPC codeword using the revised error channel estimate, improving both the speed and accuracy of the overall LDPC decoding process.

Referring to FIG. 5, a layer processor 500 performs both the check node and variable node soft-value processing steps of an LDPC decoder, for a single layer of a LDPC code. The layer processor 500 comprises a check node processor 501, a delay element 502, and adders 503 and 504. The adder 503 receives soft-value A from a main memory of an LDPC decoder. Soft-value A represents the estimated confidence of a bit of the LDPC codeword (and is typically represented as an LLR value). Soft-value A is the summation of the channel information (the initial error channel estimate or the revised error channel estimate) and the extrinsic information (previous outputs of the check node processor for this bit; in other words, the accumulated belief propagation updates to the LLR value of this bit) for a given column C in the matrix, that is $A=V_C(t)$.

The adder 503 subtracts the output of delay element 502 from soft-value A. The delay element 502 stores the extrinsic information from previous processing iterations for all rows of the H-matrix. When layer processor 500 processes a layer, the row being processed will be identified to the delay element 502 and the extrinsic information generated from a previous processing iteration of this row and column will be provided to adder 503. The adder 503 performs subtraction in order to remove, from soft-value A, the extrinsic information previously generated from this row.

Adder 503 outputs soft-value B, which represents the summation of the channel information (either the initial error channel estimate or the revised error channel estimate) and the extrinsic information generated from all rows except for the current processing row (accumulated belief propagation updates from processing all of the other rows of the H-matrix). Soft-value B can be defined by the equation $$B(t)=V_C(t)-C_{C,r}(t) \quad \text{(Equation 6)}$$

where $C_{C,r}(t)$ is the extrinsic information that was previously generated at the check node processor 501 when processing the currently selected row. This subtraction ensures that the input to the check node processor 501 does not contain any information from itself from a previous layer processing iteration.

The check node processor 501 calculates an updated extrinsic information C for the current row, r, based on the following equation:

$$C_{C,r}(t+1) = f\left(\min_{j=1,N_C} B_{C,j}(t)\right) C_{C,r}(t+1) = f\left(\min_{j=1,N_C} B_{C,j}(t)\right) \quad \text{(Equation 7)}$$

In Equation 7, f is an approximation of belief propagation function and where $0<j\leq N_C$ and $j\neq r$. Common approximation functions include min-sum adjust and attenuated minimum and others as described in, for example, *Channel Codes: Classical and Modern*, by W. Ryan and S. Lin, Cambridge University Press, 2009; and in *Error Control Coding*, by S. Lin and D. J. Costello Jr., Pearson Press, 2004.

The adder 504 sums the updated extrinsic information C and the soft-value B to generate the output of the layer processor 500, which is the updated soft-value D and is defined by the following equation:

$$D(t+1)=V_C(t)-C_{C,r}(t)+C_{C,r}(t+1) \quad \text{(Equation 8)}$$

Accordingly, updated soft-value D is the summation of the channel information (either the initial error channel estimate or the revised error channel estimate) and the extrinsic information. The extrinsic information at soft-value D includes extrinsic information generated from previous check node processing iterations (extrinsic information related to processing other rows of the H-matrix) and the updated extrinsic information generated from the current check node processing iteration (extrinsic information related to processing the currently selected row of the H-matrix).

While soft-value A represents the estimated confidence of a bit of the LDPC codeword before a belief propagation update of the LDPC decoder, soft-value D represents an updated estimated confidence of a bit of the LDPC codeword after a belief propagation update.

The delay element 502 stores the updated extrinsic soft-value C for this column and row and saves it for the next time this column is processed in order to be used by adder 503 for generating soft-value B.

In a further embodiment of the LDPC layer processor 500, the LLRs at all nodes within the device are configured to be fixed-precision elements. The nature of LDPC decoding benefits from very high dynamic ranges of operation but, to limit area and power consumption of commercial implementations, fixed precision values are sometimes selected. The precision limits for nodes within the LDPC decoder are selected so that the decoder exhibits frame error rate (FER) performance that is close to ideal. Each particular application and design selects the precisions to trade off performance and power: the lower the precision, the worse the FER performance but the smaller the decoder area and power consumption.

In the conventional LDPC layer processor 400, for example, the decoding starts with an initial error channel estimate (the channel information) and adds belief propagation updates (the extrinsic information) to the initial error channel estimate. The initial error channel estimate assumes initial device conditions. Over time, conditions such as PVT, program-erase, and retention state change. Therefore, the decoding in the conventional LDPC layer processor 400 may be based on out-of-date assumptions.

In contrast, embodiments of the present disclosure are able to update the initial error channel estimate to generate a revised error channel estimate that more closely models current device operating conditions. The LDPC layer processor 500 further comprises soft-value updater 505, adders 506 and 507, and delay element 508 in order to improve the performance of layer processor 500. In general, the number of errors present in a FEC codeword is continually reduced during the decoding process. Assuming that an entire FEC codeword is received from a single error channel condition, the statistics of previously corrected errors can be used to update the error channel model used for the FEC clock.

The soft-value updater 505 compares a current state of the FEC codeword to an initial state of the FEC codeword in order to identify bits corrected between the previous and current states of the FEC codeword.

The adder 507, delay element 508, and soft-value updater 505 revise an error channel estimate based on the identified corrected bits. The error channel estimate is, for example, a model of the BAC indicating the four bit transmission probabilities of the BAC. The revised estimate represents a change in the BAC error channel over time and may be indicated by different bit transmission probabilities.

In an embodiment, the error channel 102 is a BAC 200. The soft-value updater 505 counts all four BAC probabilities (P00, P01, P10, and P11) based on the comparison of the current FEC codeword and the initial FEC codeword. The soft-value updater 505 uses the following equations to generate new LLRs:

$$\text{newLLR0}=\log(P00/P10) \quad \text{(Equation 9)}$$

$$\text{newLLR1}=\log(P01/P11) \quad \text{(Equation 10)}$$

The delay element 508 stores a current LLR setting in order to scale the newly calculated updated LLRs to the input channel values. This allows future updates to take place against the currently used channel estimate. Delay element 508 stores the LLRs according to the following equations:

$$\text{currentLLR0}=\text{newLLR0} \quad \text{(Equation 11)}$$

$$\text{currentLLR1}=\text{newLLR1} \quad \text{(Equation 12)}$$

The delay element 508 may also be initialized with the original channel inputs.

The adder 507 subtracts the current LLRs from the new LLRs to generate an LLR update that is scaled to the input channel values. The adder performs the following equations:

$$\text{Update0}=\text{newLLR0}-\text{currentLLR0} \quad \text{(Equation 13)}$$

$$\text{Update1}=\text{newLLR1}-\text{currentLLR1} \quad \text{(Equation 14)}$$

Finally, the adder 506 updates the soft-value of the FEC codeword according to the revised error channel estimate. The adder 506 updates the soft-values of the FEC codeword with the updated LLRs derived from Equations 9-14.

The update frequency can be once every integer number of layers within the layered LDPC decoder, and should generally be at least once every iteration. The first application of the channel update is typically done after at least one full iteration of processing has been completed. In an embodiment, the first application time and the period of application are configurable parameters.

In further embodiments, the number of bits of information collected for each LLR is greater than 1, as discussed in the previous examples. For Flash channels (and other forms of Non-Volatile-Memory (NVM) applications) this is accomplished with additional reads from the Flash device. Such reads can be from the same location on the Flash with altered read conditions such as VT-shifting or can be from related portions of the flash (alternate pages in MLC or TLC, or Write-disturb pages). Such additional reads increase the number of channel conditions over which statistics and LLRs must be tracked. In these cases, the LDPC layer processor 500 models the channel conditions for all possible read states. Further, for each of the possible channel inputs, the LDPC layer processor 500 generates an LLR update. Accordingly, the LLR update equations of soft-value updater 505 are modified in this embodiment:

$$\text{newLLR}n=\log(P0n/P1n) \quad \text{(Equation 15)}$$

Figure 6:
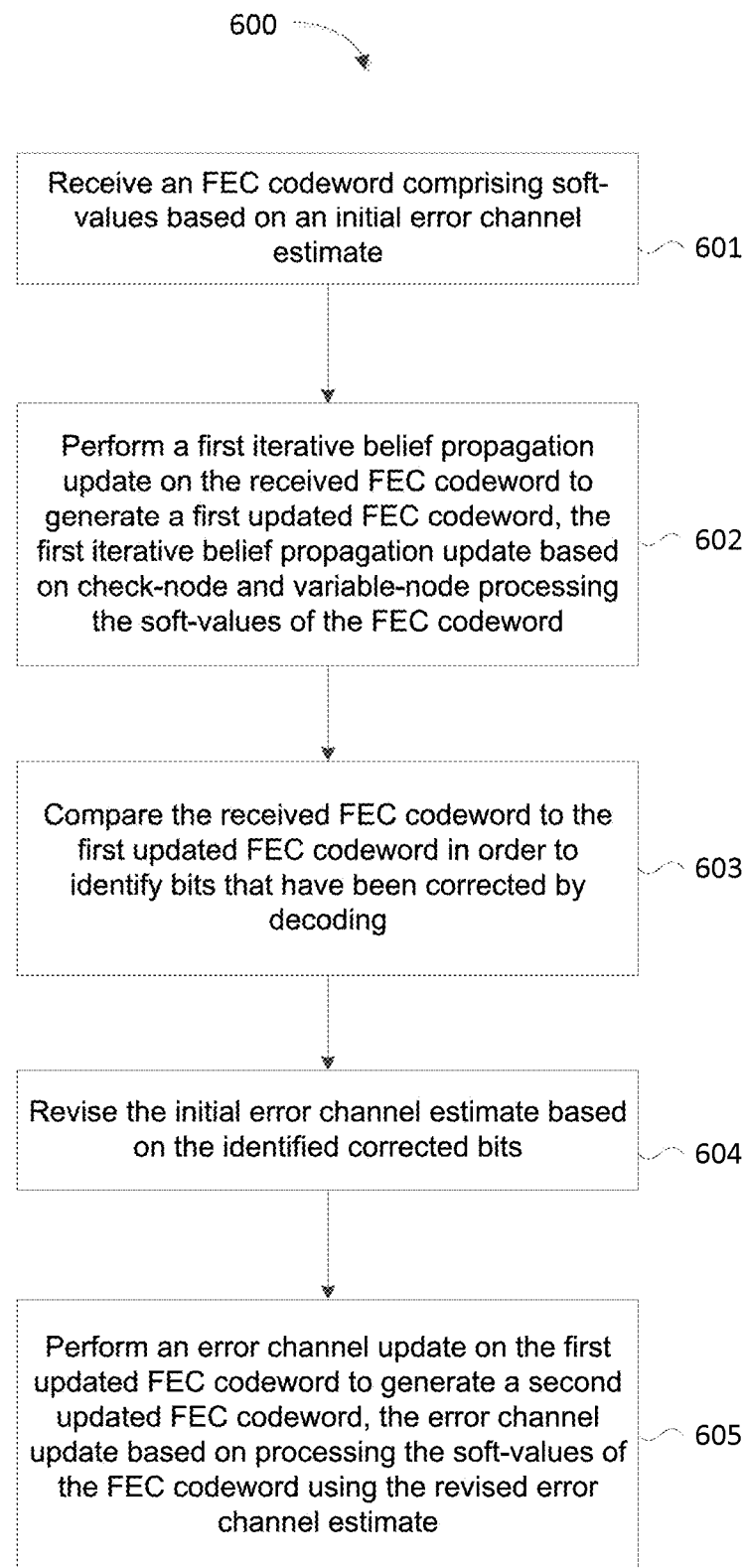
FIG. 6 is flowchart of a method for decoding an LDPC codeword according to an embodiment of the present disclosure.

FIG. 6 is flowchart of a method 600 for decoding an FEC codeword according to an embodiment of the present disclosure. According to some embodiments of the present disclosure, the FEC codeword may, without limitation, be an LDPC codeword for decoding at an LDPC decoder.

At 601, an FEC decoder receives the FEC codeword comprising soft-values based on an initial error channel estimate.

At 602, the FEC decoder begins decoding the FEC codeword by performing a first iterative belief propagation update on the received FEC codeword. The first iterative belief propagation update generates a first updated FEC codeword. The first iterative belief propagation update is based on check-node and variable-node processing the soft-values of the FEC codeword.

In the next decoding step, at 603 the FEC decoder compares the received FEC codeword to the first updated FEC codeword in order to identify bits that have been corrected by decoding. Identifying these bits allows the FEC decoder, at 604, to revise the initial error channel estimate based on the identified corrected bits. By identifying the corrected bits, the FEC decoder can count the number of times each input condition of all of the bits of the received FEC codeword is decoded to a zero state and to a one state in the first updated FEC codeword. This count is used in Equations 9 and 10 to calculate updated probabilities of each input condition being decoded to the zero state and to the one state, which is indicative of the current error channel conditions. Therefore, at 604, the FEC decoder is able to revise the initial error channel estimate. In an embodiment, 604 is performed by the adder 507, the delay element 508, and the soft-value updater 505 of FIG. 5 and provides advantages as described in relation thereto.

At 605, the FEC decoder performs an error channel update on the first updated FEC codeword to generate a second updated FEC codeword. The error channel update is based on processing the soft-values of the FEC codeword using the revised error channel estimate. In operation, the updated probabilities calculated at 604 are scaled and added to the soft-values of the FEC codeword. Since the updated probabilities calculated at 604 are representative of the revised error channel estimate, the soft-values are thus processed using the revised error channel estimate. In an embodiment, 605 is performed by the adder 506 of FIG. 5 and provides advantages as described in relation thereto.

According to the method 600, the FEC decoder processes the soft-values of the FEC codeword using information that is more representative of the current error channel conditions of a typical Flash memory device, for example. Therefore, the method 600 allows the FEC decoder to operate more efficiently and accurately.

Figure 7:
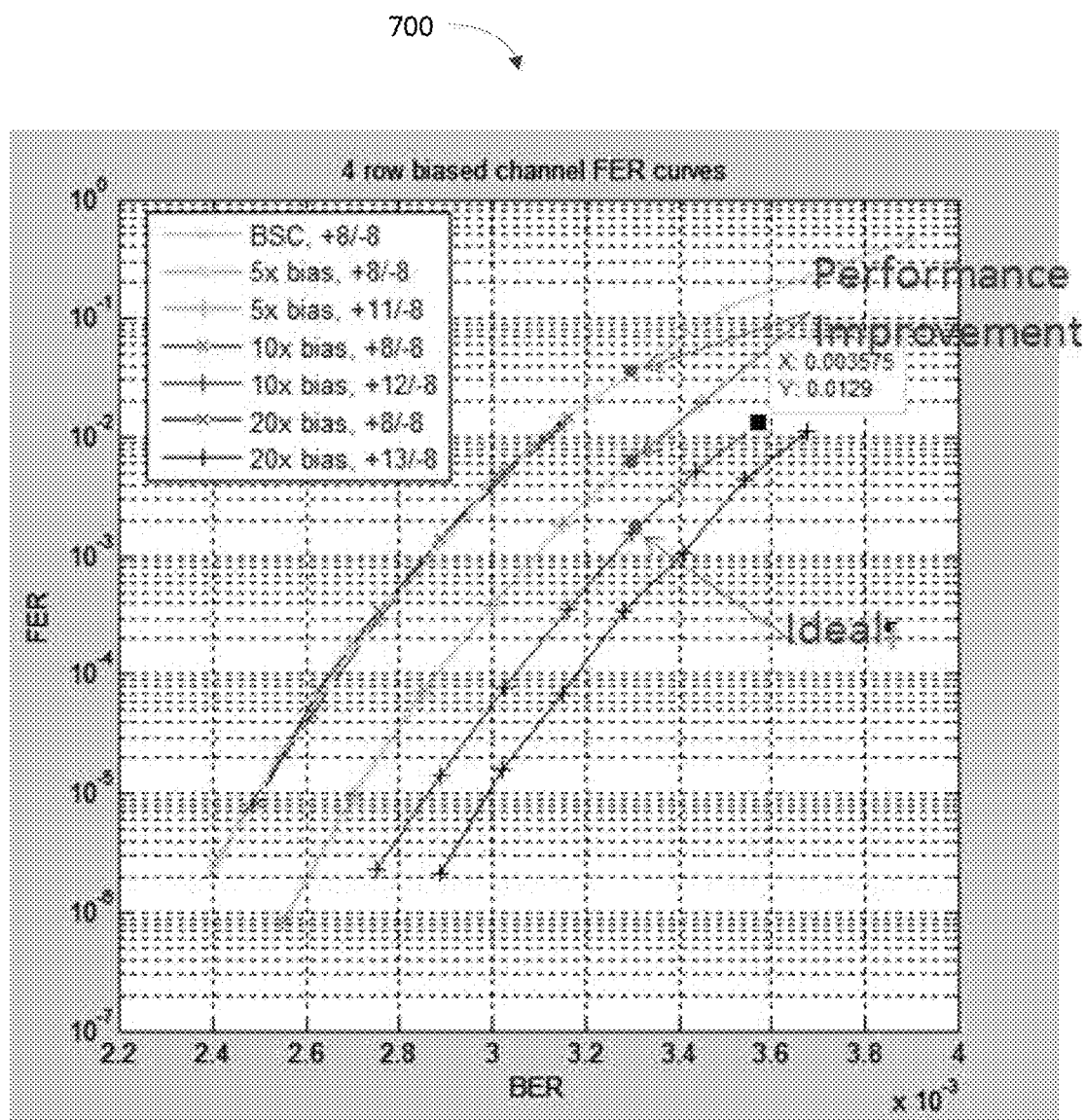
FIG. 7 is a graph comparing decoding accuracy performance of an LDPC decoder according to an embodiment of the present disclosure.

FIG. 7 is a graph 700 comparing decoding accuracy performance of an LDPC decoder according to an embodiment of the present disclosure. Graph 700 shows the Frame Error Rate (FER) vs. Bit Error Rate (BER) plots for several different cases of LDPC decoding with different channel and input LLR configurations.

Graph 700 compares the performance of a conventional LDPC decoder operating according to a Binary Symmetric Channel error channel model, and an LDPC decoder according to an embodiment of the present disclosure. In the LDPC decoder according to an embodiment of the present disclosure, the initial error channel model is also BSC, but the LDPC decoder is able to update its error channel model during, and as a result of, the soft-decoding process.

The actual error channel is BAC and exhibits an error bias of 10×. When the experiment is set to an input BER level of 3.3e-3, the LDPC decoder operating according to the BSC error channel model achieves a FER of 3e-2. In contrast, the LDPC decoder according to embodiment of the present disclosure, and using the method of decoding shown in FIG. 6, achieves a FER of 6e-3, a factor of 5 improvement in FER performance. For this particular experiment, the first channel update was provided after 1.5 iterations of decoding and updated every full iteration (i.e., updates at iterations 1.5, 2.5, 3.5 etc.). More frequent updates would likely improve performance further.

Furthermore, during the experiment, the average iterations of decoding were reduced from 7 for the LDPC decoder operating according to the BSC error channel model, to 5.75 for the LDPC decoder using the method of decoding shown in FIG. 6. The ideal case with full a-priori knowledge of the channel required 5 average iterations of decoding.

FIG. 7 demonstrates the advantages of updating the initial error channel estimate to generate the revised error channel estimate, according to the embodiments of the present disclosure. If the error channel estimate is not updated, then, at a given input BER, an LDPC decoder will always have the same FER curve. If the error channel model contains bad assumptions, (e.g. assuming a binary symmetric channel) then the decoder performance follows a poor FER curve (e.g. BSC FER curve) even though the under-lying statistics of the channel may not be correct for the assumption.

Ideal performance can only be attained if the decoder a-priori knows what the error channel parameters are. This is true of any LDPC code and any implementation of an LDPC decoder. The more accurate the error channel information compared to real statistics, the better the FER performance of the decoder will be and the lower the number of iterations will be required to solve the FEC equations.

For Flash channels (and others) it is effectively impossible to know a-priori what the channel LLR values should be. Characterizing and tracking the error channel conditions of a Flash device is very difficult. Even trying to closely model the real statistics a-priori is very difficult. The engineering effort to generate a useful initial error channel estimate is very high. The sources of error for a Flash storage device, shown in FIG. 3, describe the reasons why a-priori characterization of the initial error channel estimate is so difficult. Some of the error channel characteristics vary over time (e.g., PVT variation); some of the error channel characteristics require too much overhead (e.g., page number variation); and some of the error channel characteristics are even un-modelled. According to embodiments of the present disclosure, much of this engineering cost can be avoided.

In a further embodiment of the present disclosure, the error channel conditions may be well understood, removing the need for updating the error channel model. In this embodiment a controller determines whether the initial bit transmission probabilities exceed a threshold of accuracy, and disables the operation of soft-value updater 505, adders 506 and 507, and delay element 508.

In another embodiment of the present disclosure, the soft-value updater dithers an LLR value in order for the FEC decoder implement fractional LLR values. For example, consider that the ideal setting for a given LLR value is 8.5. The soft-value updater can set a value of 9 for one cycle of operation and 8 for the next. By alternating between these two settings an effective average value of 8.5 can be obtained for the LLR.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A method for decoding a Forward Error Correction (FEC) codeword, the method comprising:
   receiving the FEC codeword comprising soft-values based on an initial error channel estimate; and
   decoding the received FEC codeword, wherein the decoding is iterative and includes first and second belief propagation updates among a plurality of belief propagation updates, the decoding comprising:
      performing the first belief propagation update on the received FEC codeword to generate a first updated FEC codeword, the first belief propagation update based on check-node and variable-node processing the soft-values of the FEC codeword;
      comparing the received FEC codeword to the first updated FEC codeword in order to identify bits that have been corrected by decoding;
      revising the initial error channel estimate based on the identified corrected bits;
      performing an error channel update on the first updated FEC codeword to generate a second updated FEC codeword, the error channel update based on processing the soft-values of the FEC codeword using the revised error channel estimate; and
      performing the second belief propagation update on the second updated FEC codeword to generate a third updated FEC codeword, the belief propagation update based on check-node and variable-node processing the soft-values of the FEC codeword.

2. The method of claim 1, further comprising storing the received FEC codeword at an initial data memory.

3. The method of claim 1, wherein revising the initial error channel estimate comprises counting the number of times each input condition of all of the bits of the received FEC codeword is decoded to a zero state and to a one state.

4. The method of claim 3, wherein revising the initial error channel estimate further comprises computing, according to the equation $newLLRn=\log(Pn0/Pn1)$, where n represents the input condition, the probabilities of each input condition being decoded to the zero state and to the one state.

5. The method of claim 1, wherein the FEC codeword is a Low Density Parity Check (LDPC) codeword and decoding comprises decoding the LDPC codeword.

6. The method of claim 5, wherein decoding the LDPC codeword is performed using a layered LDPC decoder.

7. The method of claim 1, wherein the decoding further comprises a plurality of iterative belief propagation updates, and a further error channel update is performed before each further belief propagation update.

8. The method of claim 1, wherein the soft-values are integers, and the integer values of the soft-values are dithered to provide a fractional-like soft-value.

9. A decoder for decoding a Forward Error Correction (FEC) codeword, the decoder comprising:
   a main memory for receiving the FEC codeword comprising soft-values based on an initial error channel estimate;
   a soft-decoder for decoding the received FEC codeword, wherein the decoding is iterative and includes first and second belief propagation updates among a plurality of belief propagation updates, the decoding comprising performing a first belief propagation update on the received FEC codeword to generate a first updated FEC codeword, the first belief propagation update based on check-node and variable-node processing the soft-values of the FEC codeword; and
   a soft-value updater configured to:
      compare the received FEC codeword to the first updated FEC codeword in order to identify bits that have been corrected by decoding;
      revise the initial error channel estimate based on the identified corrected bits; and
      performing an error channel update on the first updated FEC codeword to generate a second updated FEC codeword, the error channel update based on processing the soft-values of the FEC codeword using the revised error channel estimate; and
   the soft-decoder further configured to perform a second belief propagation update on the second updated FEC codeword to generate a third updated FEC codeword, the second belief propagation update based on check-node and variable-node processing the soft-values of the FEC codeword.

10. The decoder of claim 9, further comprising an initial data memory for storing the received FEC codeword.

11. The decoder of claim 10, wherein the main memory overwrites the received FEC codeword with the first updated FEC codeword, and the soft-value updater compares the received FEC codeword in the initial data memory to the first updated FEC codeword in the main memory.

12. The decoder of claim 9, wherein the soft-value updater revises the initial error channel estimate by counting the number of times each input condition of all of the bits of the received FEC codeword is decoded to a zero state and to a one state.

13. The decoder of claim 12, wherein the soft-value updater revises the initial error channel estimate by further computing, according to the equation $newLLRn=\log(Pn0/Pn1)$, where n represents the input condition, the probabilities of each input condition being decoded to the zero state and to the one state.

14. The decoder of claim 9, wherein the decoder is a Low Density Parity Check (LDPC) decoder for decoding an LDPC codeword.

15. The decoder of claim 14, wherein the decoder is a layered LDPC decoder.

16. The decoder of claim 9, wherein the soft-decoder further performs a plurality of iterative belief propagation updates, and the soft-value updater performs a further error channel update before each further belief propagation update.

17. The decoder of claim 9, further comprising a controller to determine whether the initial error channel estimate exceeds a threshold of accuracy, and disabling the soft-value updater if the threshold is exceeded.

18. The decoder of claim 9, wherein the soft-values are integers, and the soft-value updater dithers the integer values of the soft-values to provide a fractional-like soft-value.

19. A method of updating a soft-value of an FEC codeword, the method comprising:
- comparing a current state of the FEC codeword to a previous state of the FEC codeword in order to identify bits corrected between the previous and current states of the FEC codeword;
- revising an error channel estimate based on the identified corrected bits, the revised estimate representing a change in the error channel over time; and
- updating the soft-value of the FEC codeword according to the revised error channel estimate.

* * * * *